(12) United States Patent
Dür et al.

(10) Patent No.: US 11,587,819 B2
(45) Date of Patent: Feb. 21, 2023

(54) ELECTRICALLY ISOLATED PIN-LIFTER

(71) Applicant: VAT HOLDING AG, Haag (CH)

(72) Inventors: Michael Dür, Hohenweiler (AT); Rico Rohner, Widnau (CH); Adrian Eschenmoser, Grabs (CH); Marco Apolloni, Marbach (CH)

(73) Assignee: VAT HOLDING AG, Haag (CH)

( * ) Notice: Subject to any disclaimer, the term of this patent is extended or adjusted under 35 U.S.C. 154(b) by 631 days.

(21) Appl. No.: 16/554,190

(22) Filed: Aug. 28, 2019

(65) Prior Publication Data
US 2020/0075390 A1 Mar. 5, 2020

(30) Foreign Application Priority Data
Aug. 30, 2018 (DE) .................... 10 2018 006 903.7

(51) Int. Cl.
*H01L 21/687* (2006.01)
(52) U.S. Cl.
CPC ............................ *H01L 21/68742* (2013.01)
(58) Field of Classification Search
CPC . H01L 21/68742; H01L 21/68; H01L 21/683; Y10S 269/903
See application file for complete search history.

(56) References Cited

U.S. PATENT DOCUMENTS

| | | | |
|---|---|---|---|
| 6,481,723 B1 | 11/2002 | Hao et al. | |
| 6,646,857 B2 * | 11/2003 | Anderson | ......... H01L 21/68742 361/160 |
| 8,313,612 B2 | 11/2012 | Mcmillin et al. | |
| 2020/0075390 A1 * | 3/2020 | Dür | .................. H01L 21/68742 |

FOREIGN PATENT DOCUMENTS

| | | |
|---|---|---|
| CN | 102362342 A | 2/2012 |
| EP | 3 361 316 A1 | 8/2018 |
| JP | 2006203084 A | 8/2006 |

OTHER PUBLICATIONS

DE 10 2018 006 903.7 German Search Report, dated Apr. 10, 2019, pp. 1-8.

* cited by examiner

*Primary Examiner* — Mahdi H Nejad
(74) *Attorney, Agent, or Firm* — Muncy, Geissler, Olds & Lowe, P.C.

(57) ABSTRACT

A pin lifting device is disclosed and configured for moving and positioning a substrate to be processed in an atmosphere region provided by a vacuum process chamber. The pin lifting device includes a coupling part having a coupling adapted to receive a support pin adapted to contact and support the substrate, and a drive part having a drive unit adapted to cooperate with the coupling by means of an adjusting member such that the coupling is controllably adjustable from a lowered normal position to an extended support position and back. The pin lifting device also has an insulating component located between the drive part and the coupling part and providing complete galvanic isolation between the drive part and the coupling part.

16 Claims, 3 Drawing Sheets

ELECTRICALLY ISOLATED PIN-LIFTER

Figure 1:
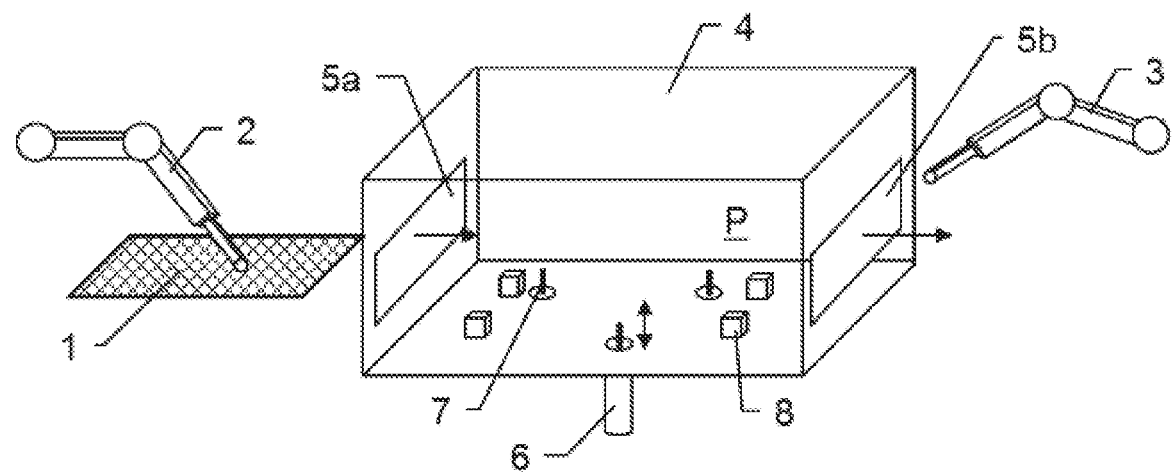

This application claims priority to German Patent application 10 2018 006 903.7 filed Aug. 30, 2018 and each of which is herein incorporated by reference in its entirety.

The invention relates to an electrically isolated pin lifting device for the movement and positioning of a substrate in a process chamber by means of a support pin.

Pin lifting devices, also known as pin-lifters, are typically designed and provided for the accommodation and defined positioning of a substrate to be processed in a process chamber. These are used in particular for vacuum chamber systems in the area of IC, semiconductor, flat panel or substrate production, which must take place in a protected atmosphere without the presence of contaminating particles.

Such vacuum chamber systems comprise in particular at least one evacuatable vacuum chamber which is provided for receiving semiconductor elements or substrates to be processed or produced and which has at least one vacuum chamber opening through which the semiconductor elements or other substrates can be guided into and out of the vacuum chamber. For example, in a production plant for semiconductor wafers or liquid crystal substrates, the highly sensitive semiconductors or liquid crystal elements pass sequentially through several process vacuum chambers in which the parts located within the process vacuum chambers are each processed by means of a processing device.

Such process chambers often have at least one transfer valve whose cross-section is adapted to the substrate and robot and through which the substrate can be introduced into the vacuum chamber and, if necessary, removed after the intended processing. Alternatively, a second transfer valve may be provided through which the processed substrate is removed from the chamber, for example.

The substrate, e.g. a wafer, is guided, for example, by a suitably designed and controlled robot arm, which can be carried out through the opening in the process chamber provided by the transfer valve. The process chamber is then loaded by gripping the substrate with the robot arm, placing the substrate in the process chamber and depositing the substrate in the chamber in a defined manner. The process chamber is emptied accordingly.

For the placement of the substrate and for the exact positioning of the substrate in the chamber, a relatively high accuracy and mobility of the substrate must be ensured. For this purpose, pin lifting systems are used which provide a plurality of support points for the substrate and thus a load distribution (due to the dead weight of the substrate) over the entire substrate.

For example, the substrate is positioned by means of the robot above the support pins of the lifting device and placed on the pins to be deposited. After the robot has moved away, the substrate is deposited by lowering the pins on a carrier, e.g. a potential plate or chuck (a device for fixing a substrate firmly during the processing process (clamping means)), and the robot arm, which typically carries the substrate, is moved out of the chamber, e.g. simultaneously with the depositing of the substrate. The pins can be lowered further after depositing the substrate and are then separated from it, i.e. there is no contact between the pins and the substrate. Alternatively, the support pins can remain in contact with the substrate.

After removing the robot arm and closing (and introducing process gas or evacuating) the chamber, the processing step is performed.

A low force effect on the substrate is particularly important even after the process step has been carried out in the chamber and when the substrate is subsequently raised, as the substrate can adhere to the carrier, for example. If the substrate is pushed away from the carrier too quickly, the substrate may break, as the adhesive forces cannot be overcome or dissolved at least at certain contact points. In addition, even if contact is established between the support pins and the substrate, any impact with the substrate can lead to undesired stress (or breakage).

At the same time, in addition to the gentlest possible and careful treatment of the substrates to be processed, the shortest possible processing time should also be made possible. This means that the substrate can be brought into the defined states—loading and unloading position and processing position—in the chamber as quickly as possible.

To avoid unwanted shocks during the processing of semiconductor wafers, for example, U.S. Pat. No. 6,481,723 B1 proposes the use of a special stop device instead of hard motion stops in a pin-lifter. Here, hard plastic stops are to be replaced by a combination of a softer designed stop part and a hard stop, wherein contact is first made with the soft stop part to limit the movement and the hard stop is then brought into contact with the soft stop part in a correspondingly damped manner.

U.S. Pat. No. 6,646,857 B2 proposes a regulation of the lifting movement by means of a recorded occurring force. The support pins can be moved as a function of the force signal received so that the lifting force at the support pins is always applied to the wafer in a controlled and dosed manner.

With each processing cycle, the support pins are brought into contact with the substrate to be picked up and released from it. This naturally results in corresponding mechanical stresses on the pins. The processing cycles are often comparatively tight and require a relatively short process time. A large number of repetitions in a comparatively short time can be the result of this process implementation. Typically, the support pins are therefore regarded as wear material and require regular replacement, i.e. they usually have to be replaced after a certain number of cycles or a certain operating time.

Particularly when using a mechatronic pin-lifter, but also with a pneumatic pin-lifter, an undesired potential difference or an undesired potential equalization can occur by coupling the pin-lifter to the chuck or to the process chamber. This can be caused, for example, by the electric drive of the lifter or supply lines to the lifter. In addition, such an arrangement has the disadvantage that a potential at the chuck, for example a high voltage to provide plasma, induces interference in the drive of the pin-lifter.

It is therefore the object of the present invention to provide an improved pin lifting device which reduces or avoids the above disadvantages.

In particular, it is the object of the invention to provide an improved pin lifting device that allows flexible use for the processing process in a process chamber, wherein influences on the processing process are reduced or avoided by the pin lifting device.

These objects are solved by the realization of the characteristic features of the independent claims. Features which further develop the invention in an alternative or advantageous way can be found in the dependent patent claims.

The invention relates to a pin lifting device, in particular a pin-lifter, which is designed to move and position a substrate to be processed, in particular a (semiconductor) wafer, in a process atmosphere region which can be provided by a vacuum process chamber. The pin lifting device comprises a coupling part having a coupling adapted to receive a support pin adapted to contact and support the substrate. In addition, a drive part is provided which has a drive unit which in turn is designed in such a way and interacts by means of its adjusting element indirectly or directly with the coupling in such a way that the coupling is moved from a lowered normal position, in which the support pin, in the fitted state (the support pin is provided in the coupling) in an essentially action-free state (no contact with the substrate) with respect to an effect as intended with respect to it (e.g. moving, supporting and positioning a workpiece or substrate), is adjustable in a controlled manner to an extended support position in which the support pin, in the fitted state, provides its intended effect of receiving and/or providing the substrate, and is adjustable back again, in particular wherein the adjusting element is movable linearly along an adjusting axis.

The fitted state is to be understood as a state in which the support pin is held by the coupling in a received target position. A non-fitted receiving state represents a state of the coupling in which a support pin to be received is not in a held target position in the coupling.

The intended effect of the support pin is essentially the picking up, contacting, moving, carrying and/or positioning etc. of a workpiece or substrate. In this context, an action-free state of the support pin is to be understood as a condition in which the pin is contactless (not in contact yet or no longer in contact) with a substrate to be contacted as intended and in particular temporarily does not provide the intended purpose, e.g. is in a lowered waiting position. This is particularly the case while a processing process is being performed on the substrate. However, the provision of the intended effect does not exclusively mean that there is contact between the support pin and the substrate; rather, the pin can be present in this state in an extended state and held ready for the accommodation of a wafer (placement of the wafer on the pin). The processes or movements (transport of the wafer) that occur as a result of contact are also to be understood as providing the intended effect.

The device may also have a separating device for separating the process atmosphere region from an external atmosphere region, wherein the drive unit is at least partially, in particular completely, associated with the external atmosphere region and the coupling is in particular at least partially associated with the process atmosphere region. The separating device of the pin lifting device can, for example, be formed by a bellows and provided inside the housing of the pin-lifter.

The pin lifting device also has an insulating component located between the drive part and the coupling part and providing complete galvanic isolation between the drive part and the coupling part, wherein the adjustability of the coupling from a normal position to a support position and vice versa is maintained by the drive unit.

In particular, the adjusting element and the coupling are electrically isolated by the arrangement of the insulating components, i.e. they are electrically isolated by non-conductive insulation.

Such galvanic isolation allows electronic components, in particular a mechatronic drive unit in this case, to be logically separated from the process chamber (in the sense of electrical signal transmission).

Advantageously, e.g. a chuck of a process chamber as well as the pin-lifter can be set to potential or to different potentials. This largely avoids influencing or disturbing the processing device (e.g. plasma generator) by another external system (external to the process). The risk of crosstalk or superimposition of electrical signals from different sources can be reduced or eliminated. The processing processes in the vacuum chamber become more stable and, with regard to the desired process parameters, more robust and repeatable. As a result, products are obtained that have an overall lower reject rate and can be produced with consistently high quality.

Conversely and also advantageously, the insulation of the device parts can reduce or prevent interference with the electronics of the drive. Lifting a wafer is thus provided more reliably and uniformly. To lift a comparatively large substrate, a number of pin lifting devices according to the invention are typically used. These should raise and lower the substrate as uniformly as possible. By avoiding influencing individual drives of these devices, a uniform, synchronized movement of the pin-lifter can be reliably provided, which in turn reliably enables a desired movement of the substrate.

The protection of system components which are not directly connected to the processing process, i.e. which are not in contact with the vacuum volume, extends beyond the drive to connected electronics, e.g. control electronics.

In addition, so-called common-mode interference can be kept away from the signal inputs by the potential separation provided.

In one embodiment, the drive part and the coupling part can each be connected to the insulating component and the drive part can be in a fixed position relative to the coupling part by means of the insulating component. In addition, the drive part and the coupling part can be present in a contactless manner due to a physical separation provided by the insulating component; drive part and coupling part do not touch each other in this case. An electrical line between the drive part and the coupling part can thus be interrupted by the insulating component.

In particular, the insulating component may comprise an (electrically insulating, non-conductive) fixing element rigidly connected to the drive part and the coupling part and an (electrically insulating, non-conductive) coupling element movable relative to the drive part and the coupling part. This means that galvanic isolation can also be provided for the parts of the device that move with the drive unit or for elements coupled to it, e.g. support pin. This prevents a potential equalization between the drive unit and a substrate to be accommodated.

By separating coupling and drive, the coupling part can, for example, be connected to a common potential with a chuck. The coupling part can, for example, be flanged to the process chamber or to the chuck. As a result, an inserted support pin can also have an electrically conductive material, e.g. metallic material, or be made of such a material. An unwanted potential equalization (with the drive of the pin-lifter) is thus avoided despite an electrical conductivity of the pin.

Both the fixing element and the coupling element may be made of an electrically non-conductive material, in particular a polymeric or ceramic material, in particular polyether ketone (PEK) or polyether ether ketone (PEEK).

The coupling element provides in particular the interaction of the adjusting element with the coupling. For this purpose, the coupling element can be arranged as an intermediate piece between the coupling and the adjusting element and prevent an electrical line between these components.

In particular, the coupling element provides an alternative direct or indirect coupling of the drive unit with the adjusting element. The coupling element can be arranged here, for example, as a bearing or clamping device between the motor (drive unit) and the adjusting element.

Alternatively, the coupling element can be embodied by the adjusting element.

In one embodiment, the coupling element can be moved along the adjusting axis by the drive unit within an internal volume defined by the coupling part. The coupling element can then be moved mainly in the area of the upper coupling part.

According to one embodiment of the invention, the coupling element can touch the fixing element in the lowered normal position and be present in a contactless manner relative to the fixing element in the extended support position. If the adjusting element of the drive is in a retracted (lowered) state, this may correspond to the normal position.

In particular, the coupling element can be formed as a coupling sleeve, wherein the adjusting element is at least partially accommodated in the coupling sleeve and the coupling sleeve extends at least partially into a coupling recess of the coupling and is connected to the coupling recess. The adjusting element or its free end, on which, for example, a thread or an alternative connecting element can be formed, can protrude at least partially into the coupling sleeve and be connected to it. The coupling sleeve preferably has a counterpart corresponding to the connecting element of the adjusting element, e.g. an internal thread. The coupling sleeve can be connected to the coupling recess in a similar way. In addition to a screw connection with male and female thread, clamping, gluing or soldering, for example, are conceivable as alternatives.

In one embodiment, the adjusting element can be designed as a slide, which can be connected to a threaded spindle of the drive unit and is movable linearly along the threaded spindle, wherein the threaded spindle extends into the inner volume of the coupling part and in particular coaxially to the adjusting axis.

In one embodiment, the adjusting element can be designed as a threaded spindle or push rod, wherein the adjusting element can be coupled indirectly through the coupling element or directly with the coupling. Galvanic isolation can be achieved in this case by means of an insulating bearing or clamping to the drive unit.

In another embodiment, in which the coupling element is formed by the adjusting element, this can be embodied by the threaded spindle and the spindle can interact directly with the coupling. A slide can be dispensed with here. The threaded spindle is designed as an electrically insulating insulating element.

In particular, the coupling element, in particular the coupling sleeve, can have a recess dimensioned such that the part of the threaded spindle extending into the volume of the coupling part can be accommodated (variably) by the recess. In the lowered normal position, the threaded spindle can essentially fill the recess; in the extended support position, it can only partially fill the recess.

The drive unit can also have a controllable electric motor which is coupled to the threaded spindle and provides rotation of the threaded spindle during operation, especially around the adjusting axis. The pin lifting device can thus be realized as a mechatronic pin lifting device.

When the threaded spindle is rotated by means of an electric motor, a linear movement of the slide, the coupling element and the coupling can take place in the area of the coupling part, especially in the inner volume of the coupling part, through the interaction of the threaded spindle and slide.

The number of moving parts and the masses to be moved can be kept relatively low by an embodiment with slide. This allows the pin-lifter to be operated comparatively quickly and efficiently, i.e. a wafer can be raised or lowered quickly and precisely at the same time.

The slide preferably has an internal thread which corresponds to the thread of the threaded spindle. The slide can also be mounted in the pin-lifter in such a way that said pin-lifter, for example, is non-rotatably mounted by means of a linear guide (e.g. groove) and thus only has a translational degree of freedom of movement. By restricting the degrees of freedom of the slide, it can be moved linearly and positioned with high precision by rotating the spindle. Such a conversion can also absorb and counteract comparatively large forces acting parallel to the adjusting axis in the direction of the drive, e.g. forces due to the dead weight of a substrate to be processed.

In one embodiment, the adjusting element (e.g. the threaded spindle) can be connected to the drive unit in an insulating manner and the fixing element of the insulating component can also be provided for connecting the drive part and the coupling part. The electrically insulating connection can embody the coupling element of the insulating component.

The threaded spindle itself can alternatively or additionally be made of a non-conductive material and thus function as the electrically insulating coupling element of the insulating component.

In one embodiment, the drive unit can have a pneumatic drive cylinder which is coupled to the adjusting element. The pneumatic drive cylinder can cause a linear movement of the adjusting element and can preferably be connected to a thrust element, e.g. thrust rod.

In one embodiment, the insulating component may have an outer wall having an outer circular-cylindrical shape of specific spatial dimensioning, wherein the outer walls of the drive part and of the coupling part have a corresponding circular-cylindrical shape and spatial dimensioning at least in a respective contact region in which these parts are each connected to the insulating component. By adapting the external shape and dimensioning of the individual components, a homogeneous external appearance of the pin lifting device can be provided. Such a manifestation is particularly advantageous with regard to integration requirements.

Figures 2A, 2B:
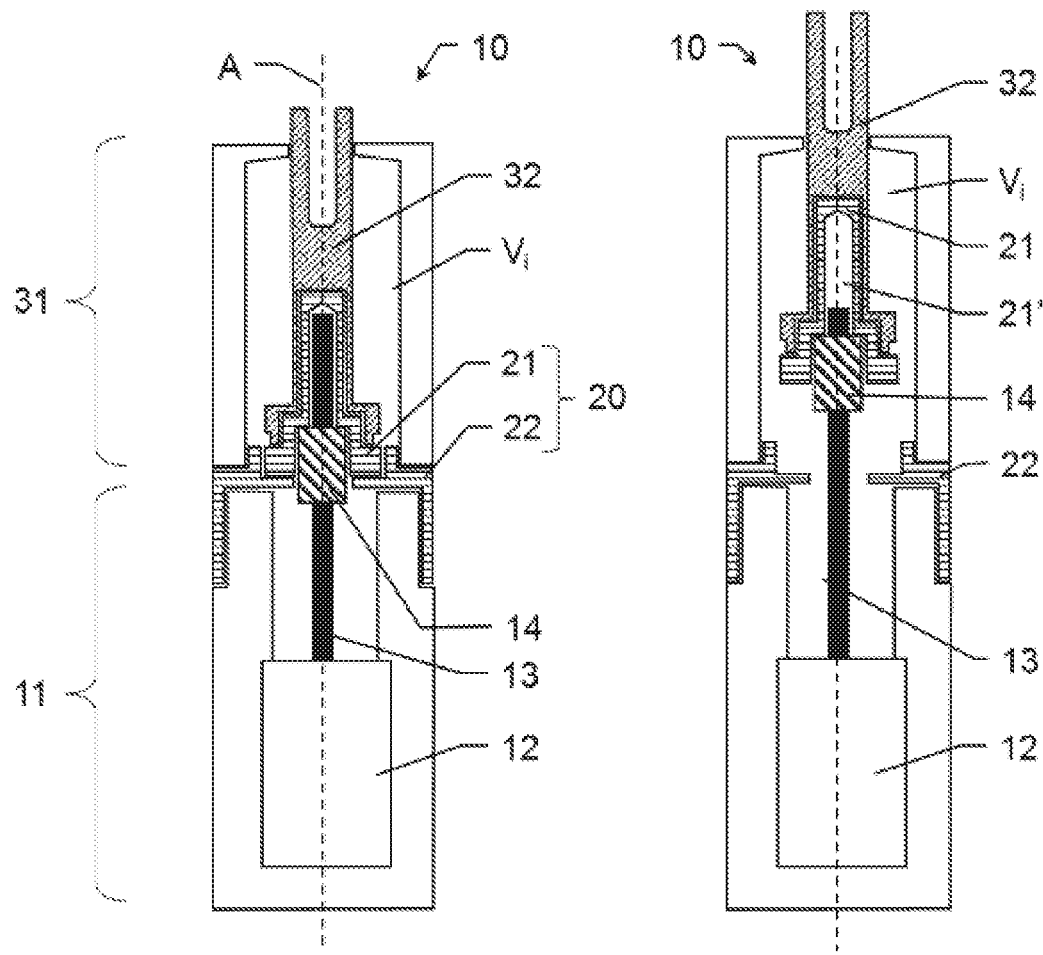
Figure 3A:
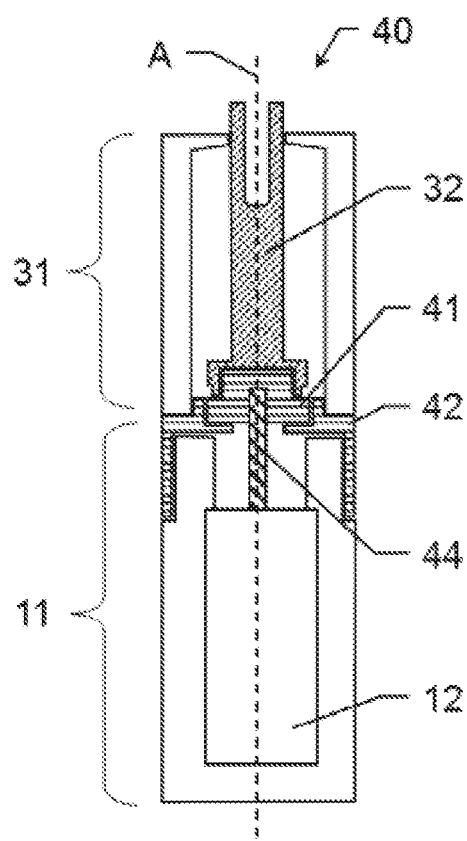
Figure 3B:
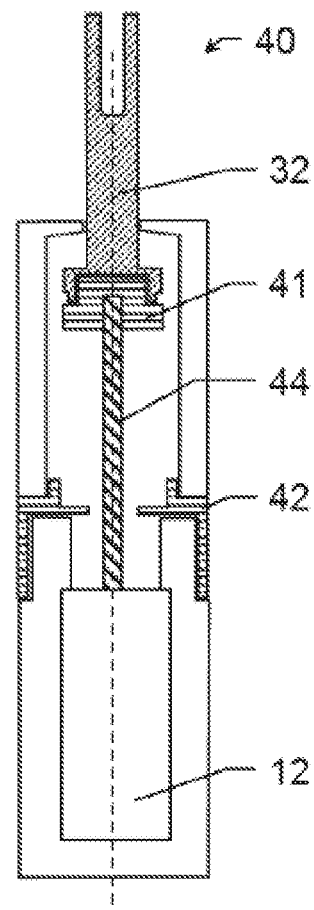
Figure 5:
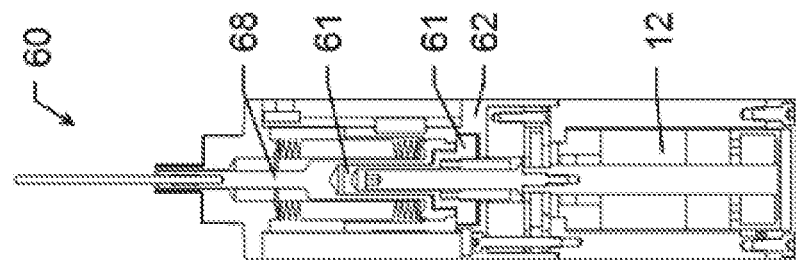
Figure 4B:
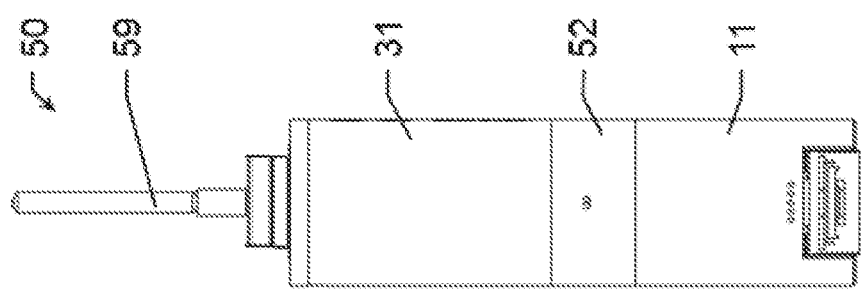
Figure 4A:
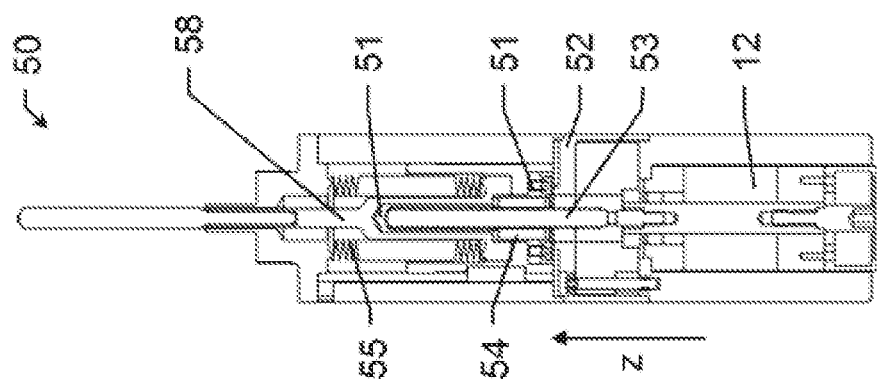

The devices according to the invention are described in more detail below by means of concrete embodiment examples schematically shown in the drawings, wherein further advantages of the invention are also discussed. The drawings shown in detail:

FIG. 1 shows a schematic representation of an embodiment of a vacuum wafer processing device having a pin lifting device according to the invention;

FIGS. 2*a-b* show an embodiment of a pin lifting device according to the invention in different states;

FIGS. 3*a-b* show another embodiment of a pin lifting device according to the invention in different states;

FIGS. 4*a-b* show another embodiment of a pin lifting device according to the invention in different views; and FIG. 5 shows another embodiment of a pin lifting device according to the invention.

FIG. 1 schematically shows a process setup for processing a semiconductor wafer 1 under vacuum conditions. Wafer 1 is inserted into a vacuum chamber 4 (process atmosphere area P) by means of a first robot arm 2 through a first vacuum transfer valve 5*a* and brought into position by means of support pins 7 of pin lifting devices according to the invention (three pins are shown here). Wafer 1 is then picked up by the pins 7 and the robot arm 2 is moved away. Wafer 1 typically rests on the robot arm or a support provided on the robot arm 2, 3 or is held by a specific support device. After wafer 1 has been picked up by pins 7, the robot arm is guided out of chamber 4, transfer valve 5a is closed and pins 7 are lowered. This is done by means of the drives 6 of the pin lifting devices which are coupled to the respective pins 7. Wafer 1 is thereby placed on the four support elements 8 shown.

In this state, a planned processing (e.g. coating) of the wafer 7 takes place under vacuum conditions and especially in a defined atmosphere (i.e. with a certain process gas and under defined pressure). Chamber 4 is coupled to a vacuum pump and preferably to a vacuum control valve for controlling the chamber pressure (not shown).

After processing, wafer 1 is lifted into a removal position again by means of the pin lifting devices. With the second robot arm 3, wafer 1 is subsequently removed through the second transfer valve 5b. Alternatively, the process can be designed with only one robot arm, with loading and unloading then taking place via a single transfer valve.

FIG. 2a shows an embodiment of a pin lifting device 10 according to the invention. The pin lifting device 10 has a drive unit 12 designed as an electric motor, which is assigned to a lower drive part 11 of the device 10. Motor 12 is coupled to a threaded spindle 13. The threaded rod 13 can be rotated by controlling the motor 12 accordingly.

In addition, an adjusting element 14 is provided, which in the illustrated embodiment is designed as a slide 14, which interacts with the threaded rod 13 and can be moved linearly along a central adjusting axis A by rotation of the rod 13. Slide 14 has an internal thread which corresponds to the thread of the threaded rod 13. In addition, the slide 14 is mounted in such a way that it cannot be rotated relative to the pin lifting device 10 itself, but can only be moved in the directions of movement parallel to the adjusting axis A.

Slide 14 is further coupled to a first part 21 of an insulating component 20, which is movable relative to the drive unit 12. This coupling element 21 can be moved and positioned linearly by the slide. The insulating component 20 also has a second part 22, a fixing element 22, fixed to the drive part 11. Both the coupling element 21 and the fixing element 22 are manufactured in such a way that they are unable to provide electrical conductivity. In particular, the coupling element 21 and/or the fixing element 22 is made of an electrically non-conductive material, e.g. plastic, or coated with a non-conductive material.

The fixing element 22 is in turn firmly connected to a housing of an upper coupling part 31 of the pin lifting device. An internal volume $V_i$ of coupling part 31 is defined by the housing. Coupling part 31 has a movable coupling 32, which is designed at a first end to accommodate a support pin (not shown). In the example shown, the coupling extends essentially along axis A. Coupling 32 is connected (at its lower part opposite the first end) to the coupling element 21 of the insulating component 20. For this purpose, the coupling 32 has an inner recess in which the coupling element 21 is received and fixed, e.g. by means of an adhesive bond or screw connection.

By means of the connections between slide 14, coupling element 21 and coupling 32, mobility of coupling 32 which is controllable by the motor 12 and thus of a support pin accommodated in coupling 32 can be provided. The coupling element 21 of the insulating component 20 also provides galvanic isolation between the support pin and drive 12.

FIG. 2a shows the coupling 32 of the pin lifting device 10 in a lowered normal position, in which an optionally provided support pin would be present in an essentially ineffective state with regard to its intended effect. When the pin-lifter 10 is provided in a vacuum processing process, the support pin typically has no contact with a substrate to be processed.

FIG. 2b shows the coupling 32 of the pin lifting device 10 in an extended support position in which a coupled pin provided its intended effect of receiving, moving and/or providing the substrate.

To reach the extended support position, the motor 12 can be actuated accordingly. For this purpose, for example, a running time of the motor or a number of rotations to be carried out for the threaded rod 13 can be stored in order to set a desired position for the slide 14.

In particular, an encoder is coupled to the drive unit 12 in order to make the movements of the motor axis monitorable and controllable.

The moving parts of the pin-lifter 10, i.e. the slide 14, the coupling element 21 and the coupling 32, are mainly moved in the area of the coupling part 31. The slide 14 and the coupling element 21 move at least essentially within the inner volume $V_i$. The coupling element 21 is sleeve-shaped in the illustrated embodiment and provides a recess 21' defined by the shape of the element 21. This recess 21' allows a variable extension of the threaded rod 13 into the coupling element 21 and thus a translational mobility of the coupling element 21 relative to the threaded rod 13.

The two elements 21, 22 of insulation component 20 thus provide galvanic isolation between drive part 11 and drive unit 12 and the housing of coupling part 31, which is arranged in a fixed position relation to them. Secondly, permanent galvanic isolation is also provided for the moving parts of drive part 11 and coupling part 31, i.e. between coupling 32 and slide 14.

An electrically conductive contact between individual components of the drive part 11 and respective components of the coupling part 31 is prevented by means of the insulating component 20 independent of a state of the pin-lifter.

In the lowered normal position, the coupling element 21 and the fixing element 22 are preferably in contact.

FIGS. 3a and 3b show another embodiment of a pin-lifter 40 according to the invention in a lowered and extended state. The pin-lifter 40 in turn has a drive part 11 with a drive unit 12 and a coupling part 31 with a coupling 32.

An adjusting element 44 of the lifter 40 is designed here as a push rod 44 and coupled with the drive unit 12.

The insulation component is again made of two parts. A fixing element 42 connects the drive part 11 to the coupling part 31. A coupling element 41 is directly connected to the push rod 44 and can be adjusted along axis A by moving the rod 44. Coupling 32 in turn is also connected to the coupling element 41. Coupling element 41 thus forms an insulation between coupling 32 and connecting rod 44, thus enabling complete galvanic isolation of the upper part, possibly connected to a process chamber or a chuck, from the lower part providing movement of a support pin.

The push rod 44 can be moved linearly by means of the drive unit 12. The drive unit 12 can be designed as an electric motor for this purpose and can have an adapted gear and/or a motion transformation unit known to persons skilled in the art, which, for example, makes it possible to convert a rotating motion into a linear motion. Alternatively, the drive unit 12 can have a pneumatic lifting cylinder through which the push rod can be moved linearly.

FIG. 4a shows another embodiment of a pin lifting device 50 according to the invention. A support pin 59 is locked in a coupling 58. The support pin 59 preferably has a metallic, polymer-based or ceramic material. In particular, the pin 59 is completely made of such a material. The locking device in the coupling 58 can, for example, be implemented magnetically or by means of a clamping device.

Coupling 58 can be moved in the z-direction by means of a slide 54. Slide 54 is coupled to a threaded spindle 53 for this purpose, which in turn can be driven by the motor 12.

The insulation between the motor 12 and the coupling 58 according to the invention is realized in a first variant by a first insulating element 52, which electrically separates an upper housing part from a lower housing part, and a second insulating element, which can be embodied by the slide 54. In this variant of the pin lifting device 50, the threaded spindle 53 is designed and mounted so precisely and rigidly that no (electrically conductive) contact occurs between the spindle 53 and the coupling 58—even with a relative movement. Alternatively, the spindle 53 is made of or coated with a non-conductive material. Thus complete galvanic isolation is provided between upper and lower part in every state of the device 50.

In a second variant, both the threaded spindle 53 and the slide 54 located on the spindle 53 can be manufactured in an electrically conductive manner (e.g. metallic). The second insulating element is formed in the form of an intermediate sleeve 51 (due to the low-tolerance representation, the sleeve is referenced several times with the reference numeral 51). The intermediate sleeve 51 encloses the upper part of the threaded spindle 53 (in the lowered position shown), physically separating both the spindle 53 and the slide 54 from the coupling 58.

In a third variant, both the threaded spindle 53, the slide 54 and the coupling 58 can be formed in an electrically conductive manner and in direct contact with each other. This ensures electrical conductivity from pin 59 to spindle 53. The second insulating element of the insulating component is designed as a coupling or bearing of the spindle 53 to the motor. The threaded spindle 53 is therefore electrically non-conductively connected to the motor 12 and electrically isolated from it. As a result of this and the separation by means of the first insulating element 52 (fixing element), a galvanic isolation according to the invention can be provided. In the lowered position shown, the slide 54 can touch the first insulating element 52 without being in physical contact with the drive part.

Pin-lifter 50 also has a bellows 55 inside the coupling part. Bellows 55 is arranged and shaped in such a way that an atmospheric separation of a process atmosphere region, in which the support pin 59 is present and a processing process usually takes place, and an external atmosphere region, in which the drive 12 and further peripheral components can be present, for example, is provided. The bellows 55 is compressed when the pin 59 is extended, wherein the atmospheric separation is maintained.

FIG. 4b shows an exterior view of the pin-lifter 50. The pin 59 protrudes from the top of the housing of the lifter 50. A fixing element 52 of the insulating component electrically isolates the lower drive part 11 from the upper coupling part 31 or their respective housings and translationally immovable parts.

FIG. 5 shows another embodiment of a pin-lifter 60 according to the invention. This pin lifting device 60 is similar to the second variant of the device described above according to FIG. 4a.

The electrically insulating fixing element 62, together with the electrically insulating coupling element 61, provides the galvanic isolation between coupling 68 and drive 12 in the form of an insulating component. The coupling element 61 is in turn formed in the form of an intermediate sleeve 61 (the sleeve is referenced several times with the reference numeral 61). The intermediate sleeve 61 encloses the upper part of the threaded spindle (in the lowered position shown) and physically and electrically separates both the spindle and the slide from the coupling 68.

It is understood that the figures shown only schematically represent possible embodiment examples. The different approaches can be combined with each other as well as with devices for substrate movement in vacuum process chambers, especially pin-lifters, according to the prior art.

The invention claimed is:

1. A pin lifting device designed for moving and positioning a substrate to be processed in a process atmosphere region of a vacuum process chamber, the pin lifting device comprising:
a coupling part which has a coupling designed to accommodate a support pin designed to contact and support the substrate;
a drive part which has a drive unit which is designed to interact with the coupling by an adjusting element in such a way that the coupling is adjustable
from a lowered normal position, in which the support pin is present in a fitted state free of action with regard to its intended use, in a controlled manner to
an extended support position, in which the support pin in the fitted state provides its intended use of accommodating and/or providing the substrate, and
that the coupling is adjustable back to the lowered normal position again,
wherein the adjusting element is movable linearly along an adjusting axis; and
an insulating component arranged between the drive part and the coupling part and configured to provide a complete galvanic isolation between the drive part and the coupling part,
wherein the insulating component comprises:
a fixing element rigidly connected to the drive part and the coupling part; and
a coupling element movable relative to the drive unit and the fixing element, and
wherein electrical conductivity between the drive unit and the coupling part is interrupted by the insulating component.

2. The pin lifting device according to claim 1, wherein the drive unit is in a fixed position relative to the coupling part by the insulating component, and
the drive unit and the coupling part are present in a contactless manner due to a physical separation provided by the insulating component.

3. The pin lifting device according to claim 1, wherein the fixing element and the coupling element are manufactured from an electrically non-conductive material.

4. The pin lifting device according to claim 3, wherein the electrically non-conductive material comprises polyether ketone (PEK) or polyether ether ketone (PEEK).

5. The pin lifting device according to claim 1, wherein the coupling element is configured to provide an interaction of the adjusting element with the coupling.

6. The pin lifting device according to claim 1, wherein the coupling element is movable along the adjusting axis by the drive unit in an internal volume defined by the coupling part.

7. The pin lifting device according to claim 1, wherein the coupling element is configured to contact the fixing element in the lowered normal position and is configured to not contact the fixing element in the extended support position relative to the fixing element.

8. The pin lifting device according to claim 1, wherein
the coupling element is formed as a coupling sleeve,
the adjusting element is at least partially accommodated in the coupling sleeve, and
the coupling sleeve extends at least partially into a coupling recess of the coupling and is connected to the coupling recess.

9. The pin lifting device according to claim 1,
wherein the adjusting element is configured as a slide which is coupled to a threaded spindle of the drive unit and movable linearly along the threaded spindle, and
wherein the threaded spindle extends into an internal volume of the coupling part.

10. The pin lifting device according to claim 9, wherein the coupling element has a recess dimensioned such that a section of the threaded spindle extending into the internal volume of the coupling part is accommodated by the recess.

11. The pin lifting device according to claim 9, wherein the drive unit comprises a controllable electric motor which is coupled to the threaded spindle and, in operation, provides rotation of the threaded spindle.

12. The pin lifting device according to claim 9, wherein during rotation of the threaded spindle, a linear movement of the slide and a linear movement of the coupling are based on an interaction of the threaded spindle with the slide.

13. The pin lifting device according to claim 1,
wherein the adjusting element is configured as a threaded spindle or push rod, and
wherein the adjusting element is coupled directly to the coupling or indirectly to the coupling via the coupling element.

14. The pin lifting device according to claim 13, wherein the drive unit is a controllable electric motor which is coupled to the threaded spindle and, in operation, provides rotation of the threaded spindle, when the adjusting element is configured as the threaded spindle.

15. The pin lifting device according to claim 13, wherein the drive unit is a pneumatic drive cylinder which is coupled to the adjusting element, when the adjusting element is configured as the push rod.

16. The pin lifting device according to claim 1,
wherein the insulating component has an outer wall with an outer circular-cylindrical shape of specific spatial dimensioning, and
wherein a wall of the drive part and a wall of the coupling part have a corresponding circular-cylindrical shape and spatial dimensioning at least in a respective contact region in which the drive part and the coupling part are each connected to the insulating component.

* * * * *